United States Patent [19]
Burzio et al.

[11] Patent Number: 5,790,058
[45] Date of Patent: Aug. 4, 1998

[54] SERIALIZING-PARALLELIZING CIRCUIT FOR HIGH SPEED DIGITAL SIGNALS

[75] Inventors: Marco Burzio, Grugliasco; Paolo Pellegrino, Turin, both of Italy

[73] Assignee: Cselt-Centro Studi E Laboratori Telecomunicazioni S.p.A., Turin, Italy

[21] Appl. No.: 721,595

[22] Filed: Sep. 26, 1996

[30] Foreign Application Priority Data

Nov. 13, 1995 [IT] Italy .................. TO95A0914

[51] Int. Cl.$^6$ .................................................. H03M 9/00
[52] U.S. Cl. .............................. 341/101; 341/100
[58] Field of Search .......................... 341/101, 100; 375/372; 370/505

[56] References Cited

U.S. PATENT DOCUMENTS 5,638,411  6/1997  Oikawa ........................ 375/372

Primary Examiner—Brian K. Young
Attorney, Agent, or Firm—Herbert Dubno

[57] ABSTRACT

The serializing-parallelizing circuit comprises, on a single integrated circuit chip (IC), a transmitter (TX) which performs the parallel-to-series conversion of the data stream, the insertion into the serial stream, with a pre-set periodicity, of a synchronism word, and the line coding of the serial stream, and a receiver (RX) in which clock signals synchronous with the data stream are extracted from a serial stream of coded data and in which the data are decoded and the decoded signals undergo series-to-parallel conversion. The transmitter (TX) and the receiver (RX) can be configured to operate with 4 or 8-bit parallelism.

7 Claims, 3 Drawing Sheets

SERIALIZING-PARALLELIZING CIRCUIT FOR HIGH SPEED DIGITAL SIGNALS

FIELD OF THE INVENTION

The present invention to devices for high speed digital signal its object is provide a serializing-parallelizing circuit for such signals, which can be made as a CMOS integrated circuit.

In a preferred application of the invention, the circuit is to be used in optical fiber serial interconnections in ATM switching systems.

BACKGROUND OF THE INVENTION

In digital equipment designed to operate at high speed, like those above, digital signals are handled in parallel, for example with 4 or 8-bit parallelism. However, as the equipment complexity increases, maintaining the parallel form for the exchange of signals on connections between different sub-systems of the equipment can give rise to serious size problems, since each connection requires as many lines as there are bits in the parallel signal. In these cases it is therefore preferred to convert the digital signals into serial form, in order to use a single transmission line which, for high speed connections, is advantageously made by an optical fiber. Of course, at the receiving side the signal needs to be reconverted into the original parallel form. The transceivers used in these systems must meet a certain number of requirements, which also influence their manufacture as integrated circuits.

First of all, they shall operate at rather high bit rates, currently around 300 Mbit/s for the preferred application, with limited power consumption. For this reason, it is desirable to fabricate them in CMOS technology. Moreover, they must include circuits that encode the serial signal so as to minimize its sensitivity to transmission errors, to allow the receiver to recover synchronism from the received data and to allow driving of optical interconnection lines, which are used ever more frequently for high speed connections within complex equipments.

A CMOS transceiver with the ability to carry out the aforesaid functions is described the commonly owned in European patent application EP-A 0 658 995. This circuit comprises a separate transmitter and receiver to handle signals with 4-bit or respectively 8-bit parallelism. In the transmitter, the input parallel stream is encoded according to a 4B/5B code to generate the number of transitions required to allow the synchronism to be recovered from the data being received, and is then converted into serial form and encoded according to a NRZI line code. The transmitter is also associated with a control wire allowing generation of a synchronism word capable of defining a transmission protocol compatible with the current ATM systems.

The known circuit has some drawbacks. The use of a synchronism word that is identical for all the cells of an ATM transmission could give rise to false recognitions, since it is fairly easy for the synchronism word to be simulated by information bit sequences.

Moreover, using the 4B/5B code to generate the transitions implies a certain waste of bandwidth, which is a hindrance for reaching the high speeds required on the serial line.

OBJECT OF THE INVENTION

It is an object of the invention to overcome these drawsbacks by a circuit which has a synchronism management such that the danger of false recognitions is eliminated and which attains the high number of transitions without bandwidth waste.

The serializing-parallelizing circuit according to the invention comprises, on a single integrated circuit chip:
  a transmitter, which receives from a first line a parallel data stream and comprises:
    means for the parallel-to-series conversion of the data stream and the insertion, with pre-set periodicity, of a synchronism word; means for the line coding of the serial stream and for sending the encoded signals over a transmission line; and means for obtaining, from clock and synchronism signals associated with the parallel data stream, signals for timing the operations of the conversion and coding means; and
  a receiver, comprising: means for receiving a serial coded data stream, sampling it and extracting therefrom clock signals synchronous with the data stream; data decoding means, connected to the output of the receiving, sampling and clock signal extracting means, and means for series-to-parallel conversion of the decoded signals.

According to the invention the means for inserting the synchronism word are arranged to insert alternately a first or a second synchronism word which present an extremely reduced overlapping range. The receiver also comprises a first logic network to recognize the arrival of a synchronism word and which of the two possible words has arrived second logic network to verifies the correct alternation, with said pre-set periodicity, of the two words and to generates, as a consequence, command signals for the decoding and series-to-parallel conversion means.

Advantageously, moreover, the encoding and decoding means comprise a data scrambler able to transform a bit sequence of a given length in the serial stream into a pseudo-random sequence of equal length, and respectively a de-scrambler able to recover the original sequence from the pseudo-random sequence.

BRIEF DESCRIPTION OF THE DRAWINGS

The above and other objects, features, and advantages will become more readily apparent from the following description, reference being made to the accompanying drawing in which.

In the description below, by way of example, reference will be made to a circuit capable of handling data streams at 4 or 8 bits. The circuit may be configured so as to suit to either degree of parallelism.

Figure 1:
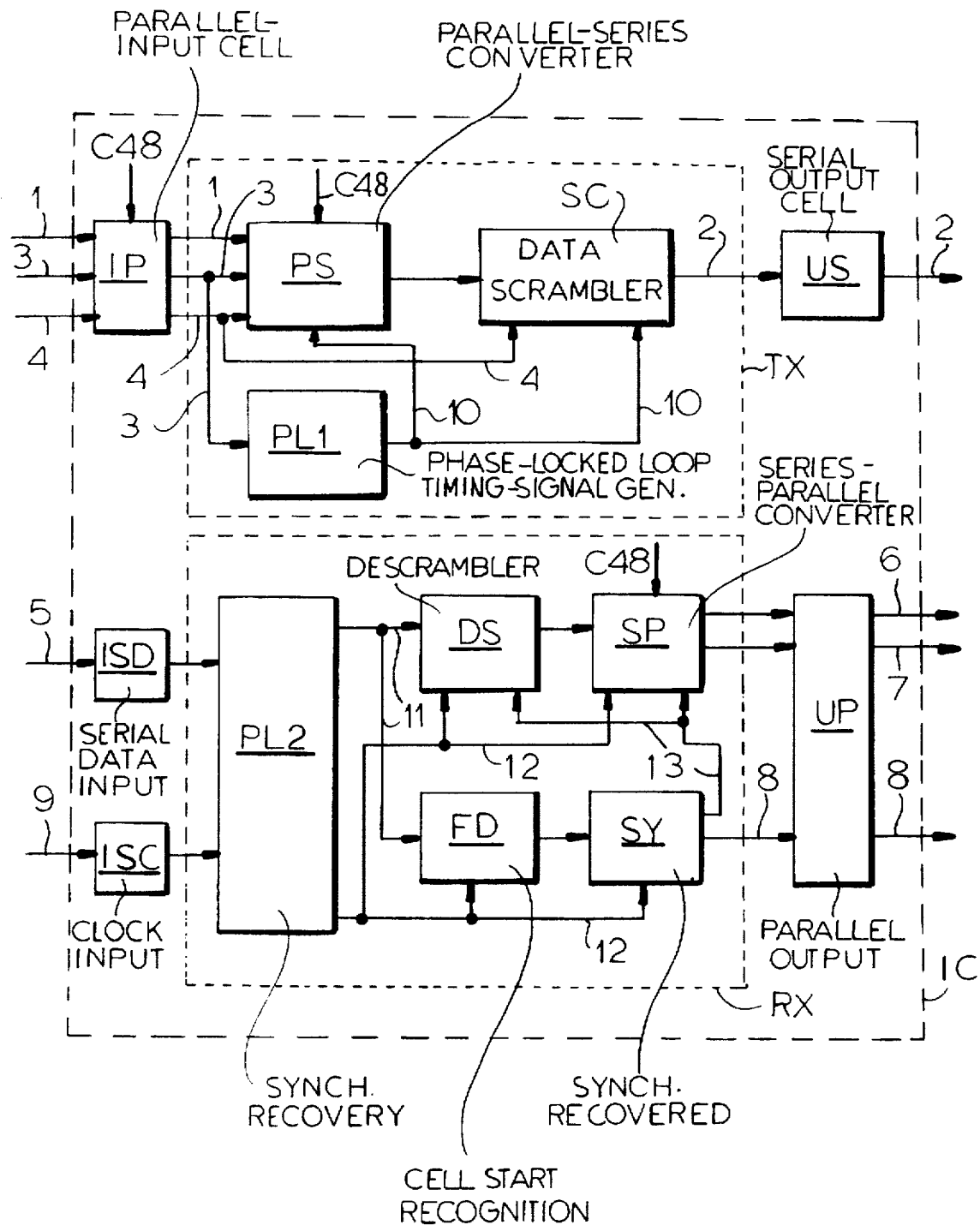
FIG. 1 is a block diagram of the circuit.

As can be seen in FIG. 1, the device according to the invention comprises, in a single integrated circuit chip IC, a transmitter TX and a receiver RX. Transmitter TX receives through an input line 1 a parallel data stream and converts it into a serial stream which is provided on output line 2. Via other input wires 3, 4 the transmitter receives clock signals, whose frequency depends on the bit rate on line 2 and on the degree of parallelism of the data stream, and a cell synchronism signal. Receiver RX performs the opposite function: thus it receives serial data through an input line 5 and provides parallel data on output line 6 and clock signals and cell synchronism signals on wires 7 and 8. RX also receives, through wire 9, a system clock signal to be used for synchronism recovery.

By way of example, reference will be made to a bit rate of 311 Mbit/s on line 2, and therefore to a 77.8 Mbit/s (4 bit parallelism) or 38.9 Mbit/s (8 bit parallelism) input bit rate. The frequency of the input clock signal shall therefore be 77.8 MHz or respectively 38.9 MHz.

A more detailed examination of the structure of transmitter TX shows that it comprises, in addition to the actual parallel-to-series converter PS, a data scrambler SC for line coding of the serial stream exiting PS and a circuit PL1 for generating the timing signals for PS and SC.

Circuit PL1 is a circuit, advantageously based on a Phase-Locked Loop (PLL), which multiplies by 4 or by 8 the frequency of the clock signal associated with the data in order to generate, on wire 10, the fast timing signal (311 MHz) required to command the operations of PS and SC. The structure of PL1 is wholly conventional.

Figure 2:
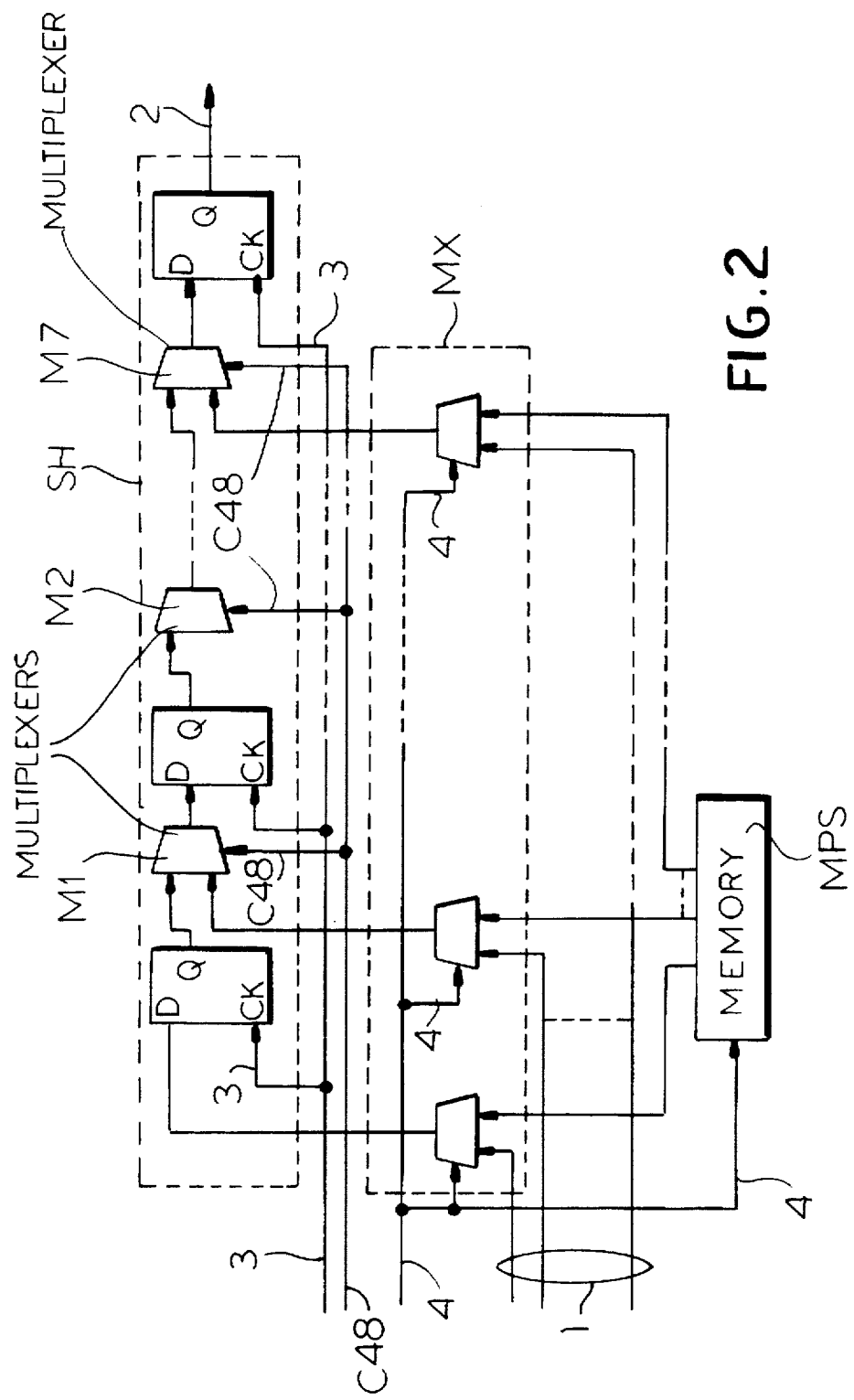
FIG. 2 is a diagram of the parallel-to-series converter.

Converter PS comprises, as can be seen in FIG. 2, a conventional shift register SH which loads either the data arriving over line 1 or, in the presence of the cell synchronism pulse, a cell start (or synchronism) byte, read from an appropriate memory MPS. For this purpose, between the cells of the shift register and memory MPS there is a bank of multiplexers MX which have a first input connected to input line 1 and a second input connected to MPS. The cell synchronism signal serves as a command for positioning multiplexers MX on the second input and as a command for reading the synchronism word. The synchronism word is chosen between two possible words such as to have a limited overlapping range or even no overlapping range, and either word is loaded into SH at alternating cells. Advantageously, the two words can be complementary to each other. In one exemplary embodiment, the two words are respectively 01010011 and 10101100. The structure of a cyclically read memory is well known to those skilled in the art.

If the circuit can be configured to handle streams with either 4 or 8 bit parallelism, register SH also receives a configuration signal C48 which commands the positioning of a second group of multiplexers M1 ... M7, internal to register SH, so as to establish the alternation between loading the bits present at the outputs of the multiplexers of MX and shifting the already loaded bits, required by the degree of parallelism. The configuration of IC in order that it can operate with either degree of parallelism is obtained by connecting a pin of the integrated circuit to either of two voltages. Signal C48 is generated by an appropriate circuit, not shown.

It should also be noted that, in the case of 4-bit parallelism, the cell synchronism signal present on wire 4 will last two cycles of the input clock signal, since loading the synchronism word requires two cycles.

Going back to FIG. 1, data scrambler SC encodes the serial streams exiting PS in such a way as to generate a signal which: has a number of transitions high enough to allow bit synchronism recovery in reception, regardless of the statistic of the input signal; lacks long sequences of consecutive 0's or 1's which would prevent the receiver from operating properly in case of a d.c. decoupling, as in the case of optical connections; and has a null average value, which is necessary in case of d.c. decoupling. Circuit SC can be implemented, with advantage, as described in ITU-T recommendation G709, according to which a pseudorandom sequence is generated by using the polynomial $1+x^6+x^7$ as a generator polynomial. Scrambler SC receives the fast clock signal as a timing signal of its operations and the cell synchronism signal as a reset signal. The latter signal operates in such a way as to let the cell start word go through unaltered.

Receiver RX comprises a synchronism recovery and data alignment device PL2, which regenerates the fast and slow clock signals starting from the incoming serial stream, synchronizes the stream with the reconstructed fast clock signal and provides, through a wire 11, the synchronized serial stream to a descrambler DS, followed by the series-to-parallel converter SP, and to a circuit FD for recognising the cell start word in the data stream circuit FD is in turn followed by a circuit SY for recognising that cell synchronism has actually been recovered.

Block PL2, also based on a PLL circuit, can be the circuit described in the aforementioned European patent application or the one described in European patent application EP-A 0 732 830, also in the name of the Applicant. This second circuit comprises a main phase locked loop, comprising a phase detector, a driven current generator, a filter and a voltage controlled oscillator, and a secondary loop, which allows the main loop to become locked by bringing the voltage controlled oscillator to oscillate at a frequency close to the operating frequency. In the main loop, the phase detector compares the phase of the data signal with that of a locally generated clock signal and provides an error signal which, through the driven current generator and the filter, continually controls the phase of the voltage controlled oscillator. The secondary loop in turn comprises a phase detector, a threshold detector and a driven current generator, which feeds said filter.

PL2 provides on a first output 11 the re-synchronised data stream and, on outputs indicated in the whole by 12, the recovered fast (311 MHz) and slow (77.8 and/or 38.9 MHz) clock signals, which are supplied to the other blocks of RX. The slow signals are also presented on output 8 of the receiver.

Descrambler DS and series-to-parallel converter SP are exactly complementary to SC and respectively PS. Similarly to SC and PS, DS and SP will receive also a cell synchronism signal, which is supplied by SY through a wire 13 and is generated as will be seen further on. Clearly, if the circuit can be configured to operate with two degrees of parallelism, SP also will have to receive configuration signal C48.

Circuit FD is a simple decoding logic, timed by the fast clock signal emitted by PL2, and aimed at recognising synchronism words in the data stream. Once recognition has occurred, FD generates a signal indicating which of the two words has been recognised and commands the execution, by circuit SY, of an algorithm verifying the regular alternation, with cell rate, of the synchronism words. In steady state conditions (i.e. under cell synchronism lock conditions), every time the correct synchronism word is recognized, circuit SY sends the cell synchronism signal to DS and SP through wire 13, and emits the same signal on wire 8 as well, with a delay equal to the operating time of DS and SP, so that the signal on wire 8 is exactly aligned with the data.

Figure 3:
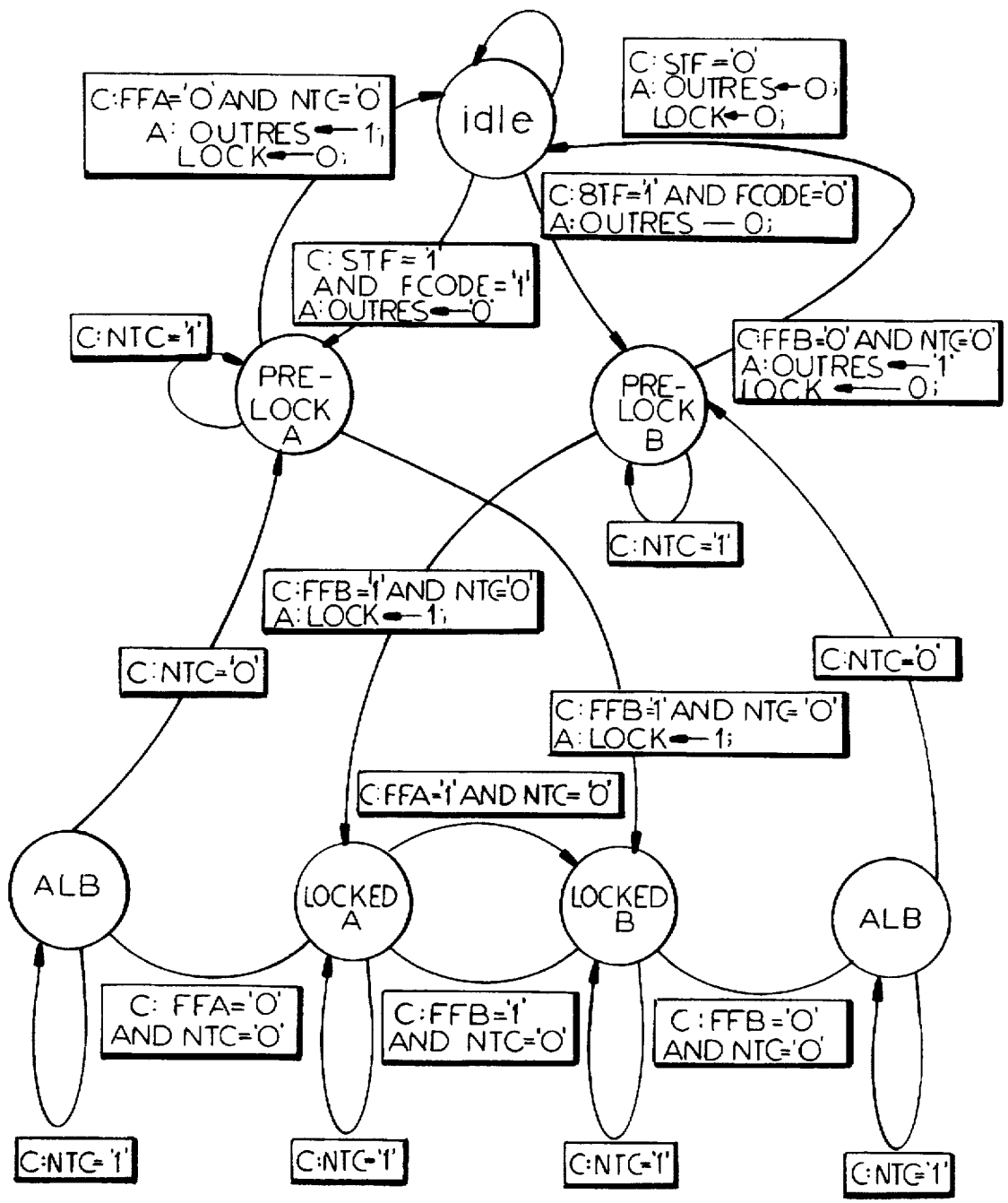
FIG. 3 is a diagram of the states of the cell synchronism management block.

Circuit SY essentially comprises a state machine, which executes the algorithm shown by the state diagram depicted in FIG. 3.

In this Figure, STF=1 indicates that a synchronism word has been recognized; FCODE=0, FCODE=1 indicate which of the two words has been recognized; FFA, FFB indicate, when they are at 1, that word A or B, respectively, has been recognized (so, they are two signals acting as logic AND of STF and of either FCODE signal); NTC=0 indicates the instant in which the arrival of a cell synchronism word is foreseen, based on the clock signal count performed by an appropriate internal counter. C, A indicate respectively the conditions that determine a transition and the actions carried out during a transition. These are of no interest for the purpose of understanding the invention and therefore shall not be examined in detail.

In particular, when STF becomes 1, SY passes from an initial state (IDLE) to one of the two synchronism pre-lock states (PRELOCK A, PRELOCK B), depending on which word has been recognized. For instance, it is assumed that FCODE=1 leads to the state labelled as A and FCODE=0 leads to state B, and that the first word recognized is the one that leads to state A. The cell counter is also started, since the following transitions occur with a cadence determined by the cell counter, in the instant in which the synchronism word arrives or, if it does not arrive, in the instant in which it is expected. From state PRELOCK A, SY goes to synchronism lock state (LOCK B) if the other synchronism word is recognised (FFA=1) after a cell period (NTC=0). Under these conditions the cell synchronism signal is generated. At the subsequent synchronism word (which, if everything is operating properly, is the one that should lead to state B and shall therefore be signalled by FFB=1) SY goes to state LOCK B. The operation is obviously analogous if the first synchronism word leads SY to state PRELOCK B. As long as the synchronism words alternate with cell rate, SY alternatively goes from one to the other lock state, each time generating the cell synchronism signal.

If, due to a transmission error, one of the synchronism words is not received correctly, SY moves on to an alarm state AL A (from LOCK B) or AL B (from LOCK A), depending on the lock state it was in. In the next cycle, the system returns to the prelock condition (always respecting the transition A→B and vice versa) and then resumes the normal cycle, if the synchronism is found, or returns to the idle state and re-starts the verification cycle, if the synchronism is not recognised again.

For the sake of completeness the drawing also shows the permanence of SY in each state (except for IDLE) between two instants of cell period end count.

Given the state diagram, the person skilled in the art has no problems in designing the logic network implementing it.

Going back to FIG. 1, the circuit also comprises input/output cells IP (parallel input to the transmitter), US (serial output from the transmitter), ISD, ISC (inputs to the receiver, for the serial data and the clock respectively), UP (parallel output from the receiver) aimed at adapting the electrical characteristics of the signals present on the external lines to those required inside integrated circuit IC and vice versa. According to the invention, input/output cells related to the parallel stream can be chosen among cells operating with different logic levels, according to the degree of parallelism and the requirements of the system in which circuit IC is inserted. In case of 4 bit parallelism, cells IP and UP can be chosen among differential cells operating with PECL logic levels (3.3 V and 4.1 V for the low and high level, respectively) or single-ended cells operating with RVS (Reduced Voltage Swing) levels, which use 0 V for the low level and 1.5 V for the high level; in case of 8 bit parallelism, input cell IP can be a single-ended cell operating with CMOS logic levels. The use of CMOS levels is not advantageous in the case of 4-bit parallelism, where the various elements of the circuit must operate with clock signals at a frequency of almost 80 MHz; obviously, the other types of cells can also be used for 8-bit parallelism. For manufacturing reasons, cells operating with PECL levels will advantageously be used only in a circuit destined to operate always with the same degree of parallelism, whereas, in case of a configurable circuit, the same integrated circuit chip may include both a cell operating with RVS levels and one operating with CMOS levels, and the cell to be used may be selected by exploiting the same signal C48 which configures the converters.

Input/output cells US, ISD for serial data flow on the contrary are preferably differential cells with PECL logic levels which on the one hand are well suited to the required bit rates and on the other allow direct connection with circuits driving optical components, which require these levels. Cell ISC associated with the system clock signal can also be either a differential cell with PECL levels or a cell with RVS levels.

Input/output cells operating with CMOS, PECL or RVS levels are well known to those skilled in the art and do not require a detailed description.

The circuit just described overcomes the drawbacks of the prior art. In fact, the alternation between two synchronism words, chosen with the criteria described above, minimises the possibility of false synchronism locks. Moreover, the data scrambler maintains unaltered the length of a coded bit sequence.

It is evident that what has been described is provided purely by way of non limiting example and that variations and modifications are possible without departing from the scope of the invention. Thus, for instance, the parallelism considered may differ from 4/8-bit, or circuit PL2 could use a Delay-Locked Loop (DLL) circuit instead of a phase-locked loop. The use of delay-locked loops to extract the synchronism from a data stream is common in the art.

We claim:

1. A serializing-parallelizing circuit for high speed digital signals, comprising, on a single integrated circuit chip:
   a transmitter which receives from a first line a parallel data stream and comprises:
      means for parallel-to-series conversion of the data stream and for insertion, with pre-set periodicity, of a synchronism word in a serial stream,
      means for line coding the serial stream to form coded signals and sending the coded signals over a transmission line, and
      means for obtaining from clock and synchronism signals, associated with the parallel data stream, timing signals for the operations of the means for conversion and for coding; and
   a receiver comprising:
      means for receiving a serial stream of coded data, sampling it and extracting from it clock signals synchronous with the data stream,
      means for decoding data, connected at an output of the means for receiving and sampling the data and extracting the clock signals to produce decoded signals, and
      means for series-to-parallel conversion of the decoded signals;
      the means for inserting the synchronism word being arranged to insert alternately a first or a second synchronism word which have a reduced overlapping range;
      the receiver comprising a first logic network for recognizing the arrival of a synchronism word and which among a first or a second word, has arrived, and a second logic network for verifying a correct alternation, with said pre-set periodicity, of the first and second words, and for generating as a consequence command signals for the means for decoding and series-to-parallel conversion and synchronism signals to be associated with the parallel data stream.

2. The serializing-parallelizing circuit defined in claim 1 wherein said first and second synchronism words are each other's complement.

3. A serializing-parallelizing circuit for high speed digital signals, comprising, on a single integrated circuit chip:

a transmitter which receives from a first line a parallel data stream and comprises:

means for parallel-to-series conversion of the data stream and for insertion, with pre-set periodicity, of a synchronism word in a serial stream, means for line coding the serial stream to form coded signals and sending the coded signals over a transmission line, and means for obtaining from clock and synchronism signals, associated with the parallel data stream, timing signals for the operations of the means for conversion and for coding; and a receiver comprising:

means for receiving a serial stream of coded data, sampling it and extracting from it clock signals synchronous with the data stream, means for decoding data, connected at an output of the means for receiving and sampling the data and extracting the clock signals to produce decoded signals, and means for series-to-parallel conversion of the decoded signals;

the means for inserting the synchronism word being arranged to insert alternately a first or a second synchronism word which have a reduced overlapping range;

the receiver comprising a first logic network for recognizing the arrival of a synchronism word and which among a first or a second word, has arrived, and a second logic network for verifying a correct alternation, with said pre-set periodicity, of the first and second words, and for generating as a consequence command signals for the means for decoding and series-to-parallel conversion and synchronism signals to be associated with the parallel data stream;

means for coding comprising a data scrambler arranged to transform a bit sequence in the serial stream into a pseudo-random sequence of equal length, and the means for decoding comprising a de-scrambler arranged to recover the original sequence from the pseudo-random sequence.

4. The serializing-parallelizing circuit defined in claim 3, further associated with lines which convey the parallel streams, for adapting the electrical characteristics of the signals present on these lines to those required inside the serializing-parallelizing circuit and vice versa, said input-output cells being chosen from a group of cells each arranged to operate with one of many different logic levels, according to the characteristics of a system in which the circuit is inserted and to the degree of parallelism of said parallel streams.

5. The serializing-parallelizing circuit defined in claim 4 wherein said group of cells comprises: differential cells operating with PECL logic levels; single-ended cells operating with RVS logic levels; single-ended cells operating with CMOS logic levels.

6. The serializing-parallelizing circuit defined in claim 4 wherein means for conversion in the transmitter and in the receiver can be configured to receive and respectively generate streams with different degrees of parallelism.

7. The serializing-parallelizing circuit defined in claim 6 wherein said different degrees of parallelism comprise a 4 bit parallelism and an 8 bit parallelism; in that said integrated circuit chip includes first input-output cells suited to operate with 4-bit parallelism and second input-output cells, suited to operate with 8-bit parallelism; and in that the transmitter and the receiver are connected to the first or the second cells by a configuration signal which also configured the means for conversion.

* * * * *